United States Patent
Roo et al.

(10) Patent No.: US 7,183,962 B1
(45) Date of Patent: Feb. 27, 2007

(54) LOW POWER ASYNCHRONOUS DATA CONVERTER

(75) Inventors: Pierte Roo, Mountain View, CA (US); Olakanmi Oluwole, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 10/848,443

(22) Filed: May 17, 2004

(51) Int. Cl.
*H03M 1/12* (2006.01)
(52) U.S. Cl. ............................ 341/155; 341/161
(58) Field of Classification Search ............... 341/155, 341/118, 120, 161
See application file for complete search history.

(56) References Cited

U.S. PATENT DOCUMENTS

| | | | | |
|---|---|---|---|---|
| 5,214,430 A | * | 5/1993 | Gulczynski | 341/120 |
| 5,841,389 A | * | 11/1998 | Kinugasa et al. | 341/159 |
| 5,936,437 A | * | 8/1999 | Kusumoto et al. | 327/94 |
| 5,936,566 A | * | 8/1999 | Park | 341/159 |
| 6,114,982 A | * | 9/2000 | Hardy et al. | 341/159 |
| 6,459,394 B1 | * | 10/2002 | Nadi et al. | 341/120 |
| 6,459,399 B1 | * | 10/2002 | Nozaki | 341/155 |
| 6,498,577 B1 | * | 12/2002 | Lin | 341/156 |
| 6,590,518 B1 | * | 7/2003 | Taft | 341/156 |
| 6,762,708 B1 | * | 7/2004 | Sutardja | 341/155 |
| 2003/0025625 A1 | * | 2/2003 | Mizuno et al. | 341/155 |

* cited by examiner

*Primary Examiner*—Linh V. Nguyen

(57) ABSTRACT

An analog-to-digital converter having N comparators is provided. Each one of the N comparators receives a common analog input signal at a corresponding first input, and each one of the N comparators provides an output representing one bit of an N-bit digital conversion of the common analog input signal. The analog-to-digital converter generates the N-bit digital conversion of the common analog input signal without using a reference clock.

89 Claims, 7 Drawing Sheets

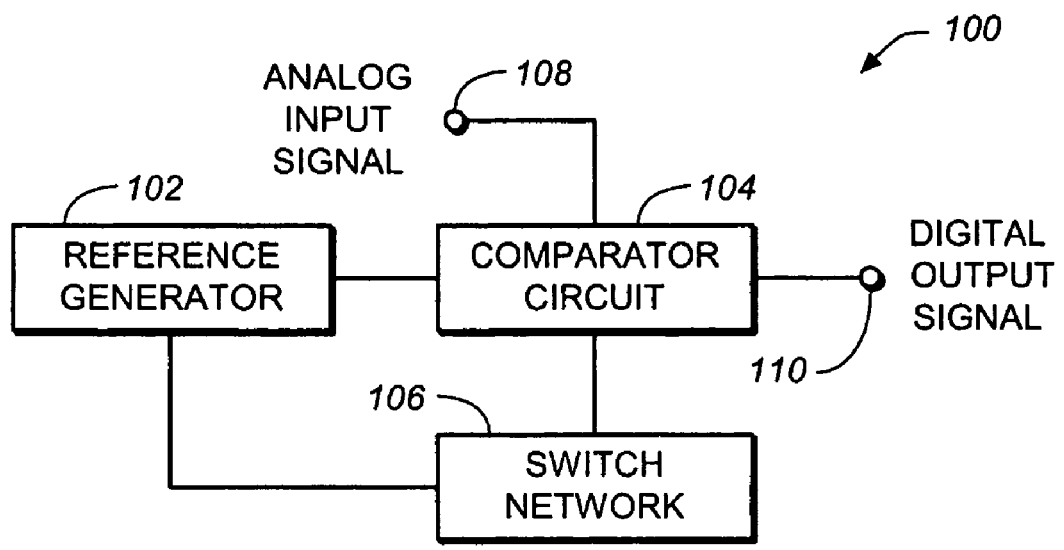
FIG._1
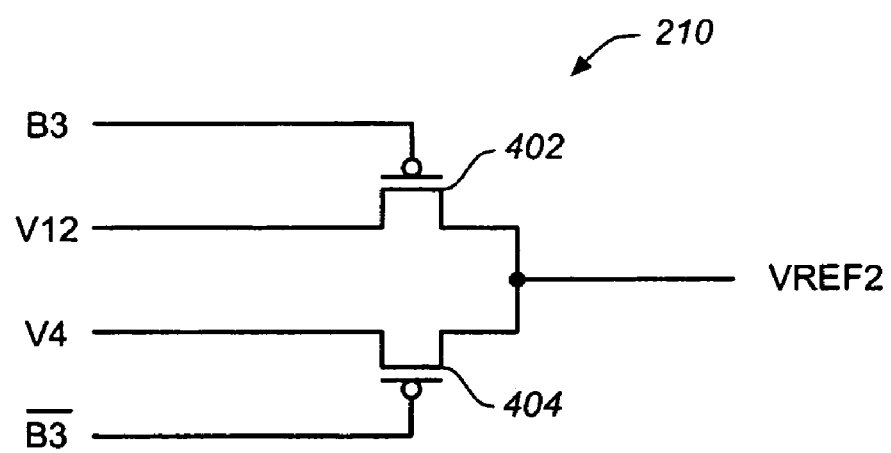
FIG._4

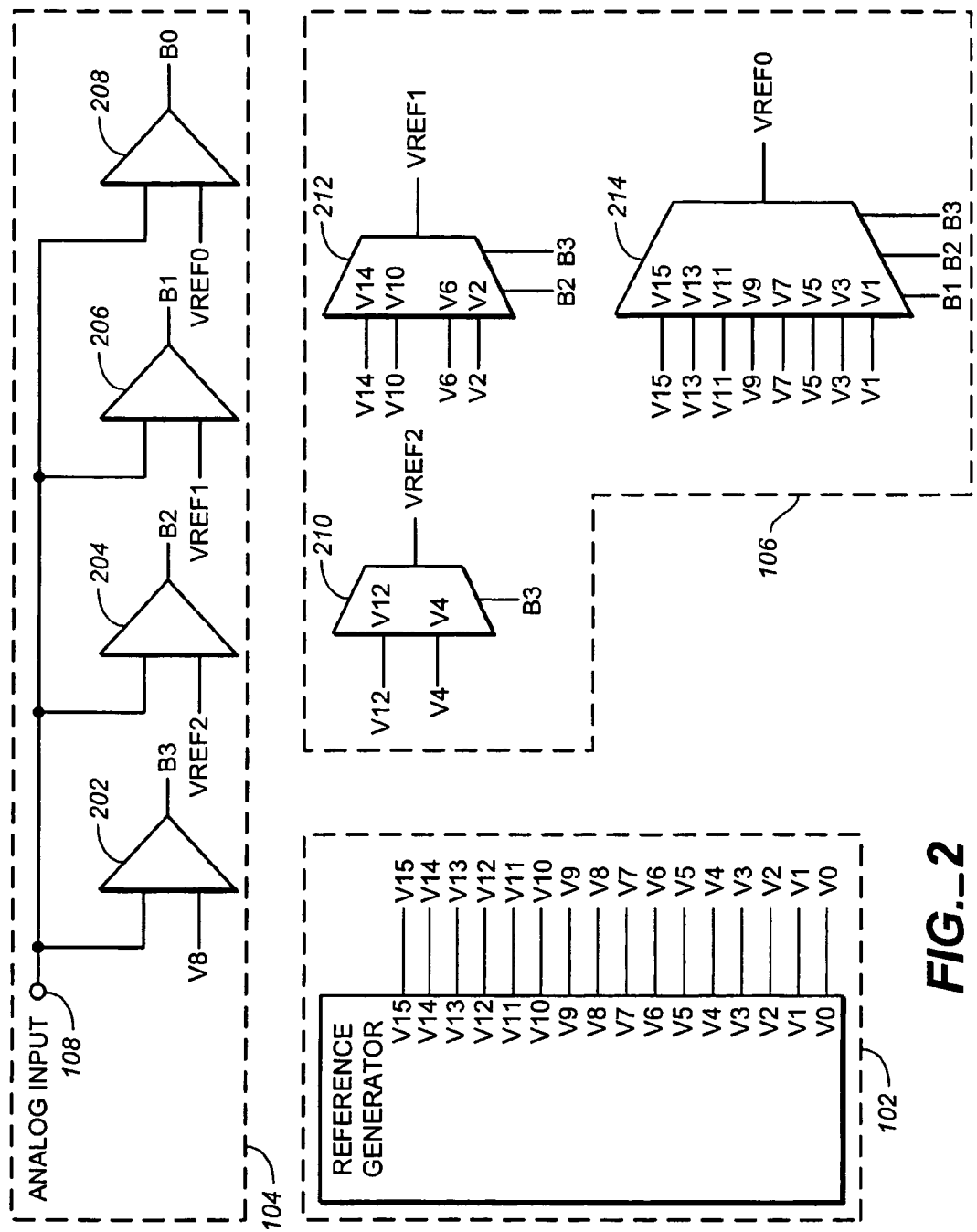
FIG._2

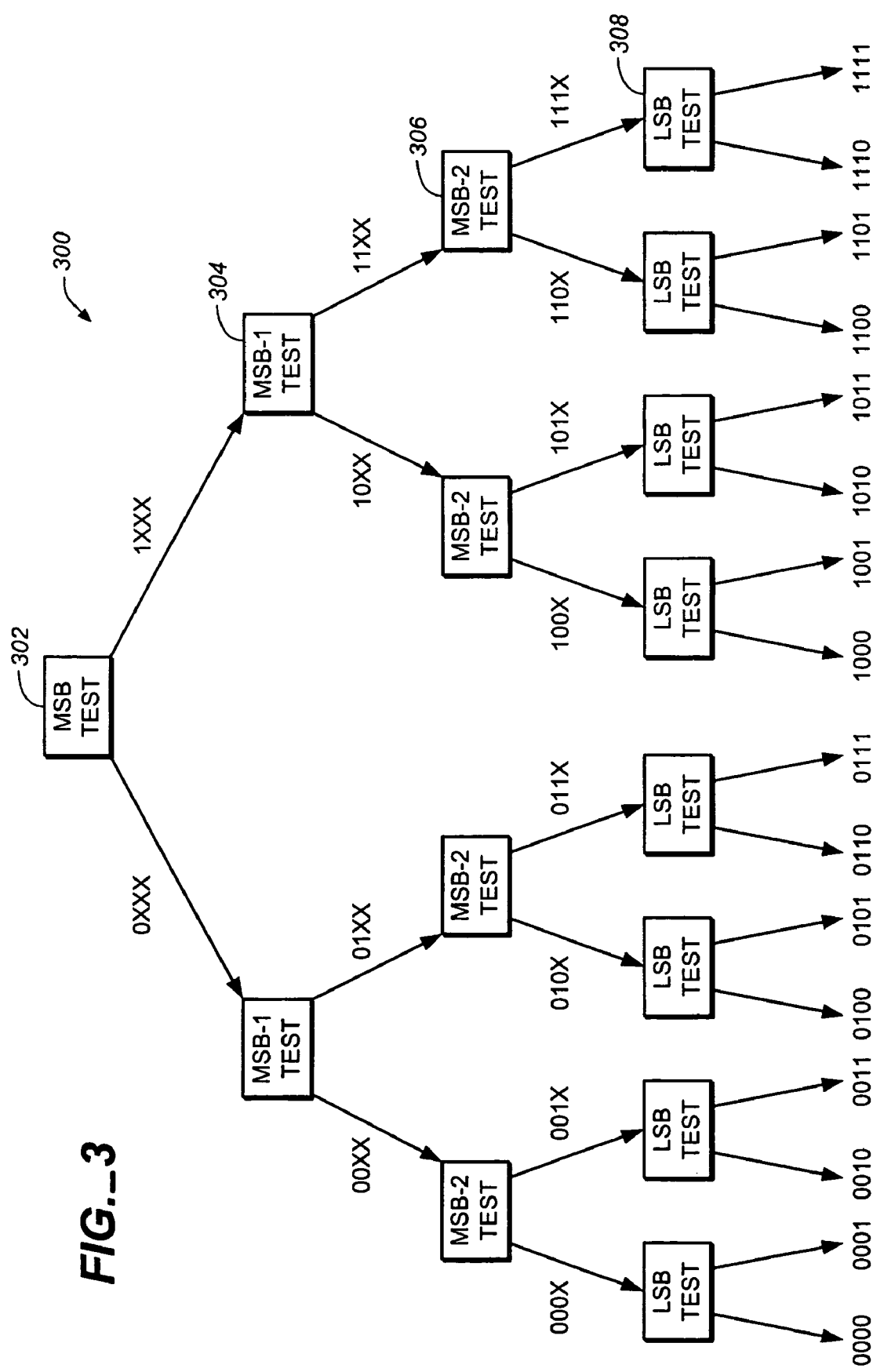
FIG._3

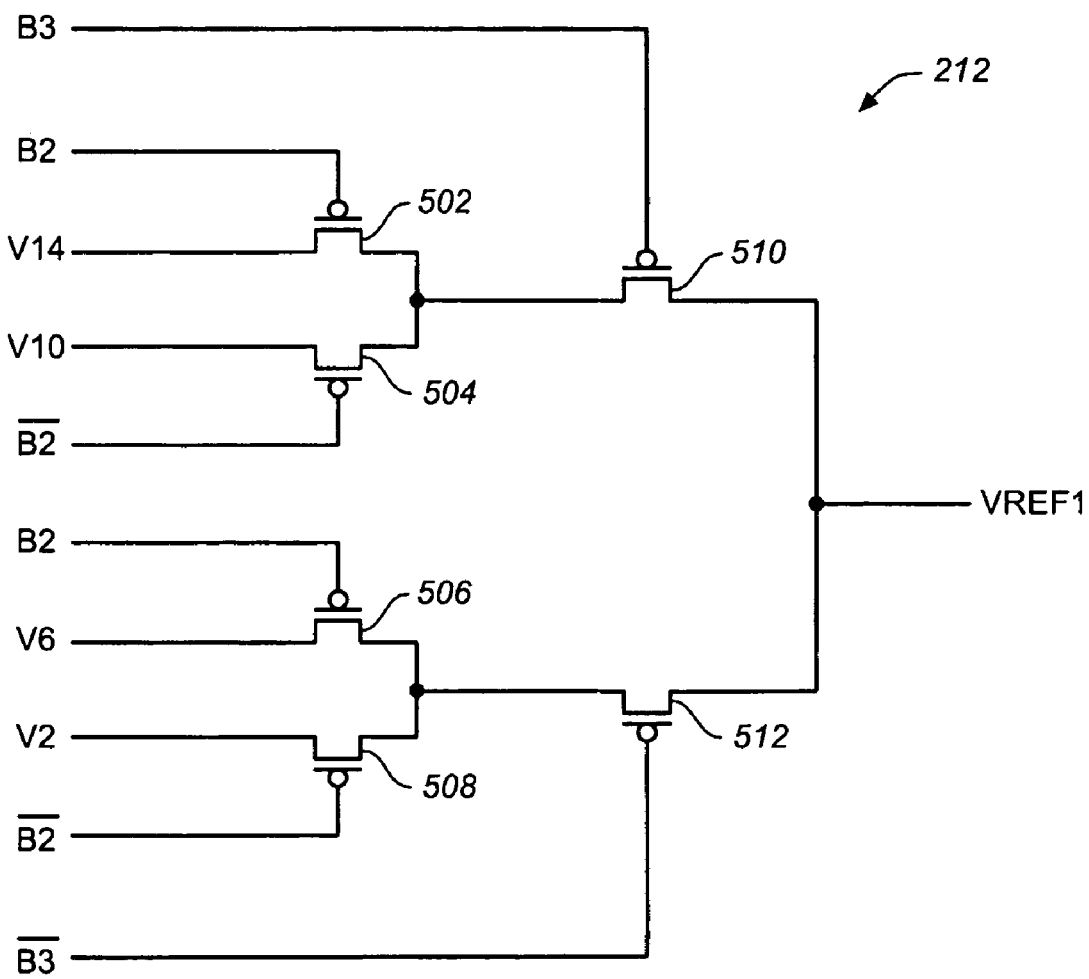
FIG._5

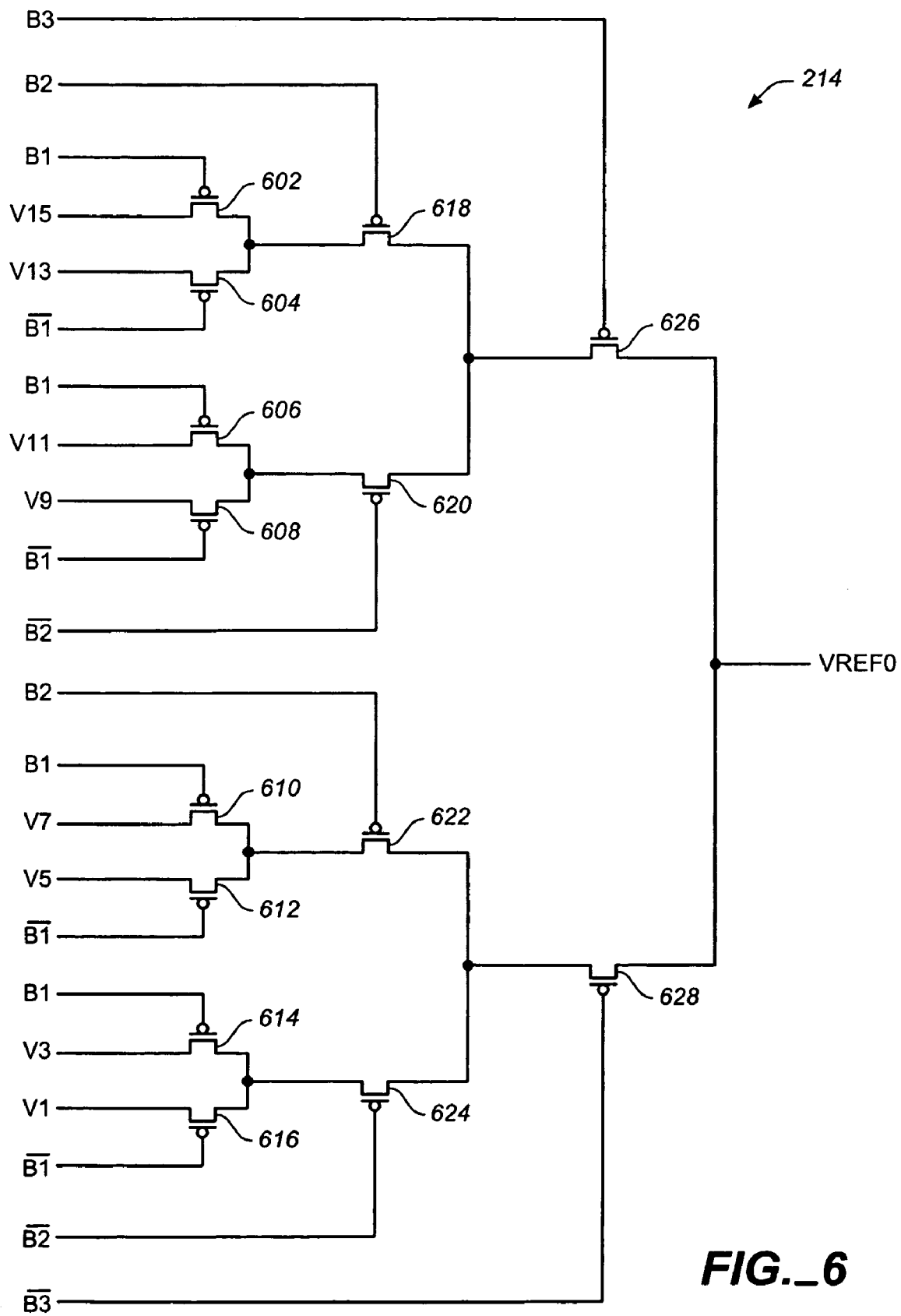
FIG._6

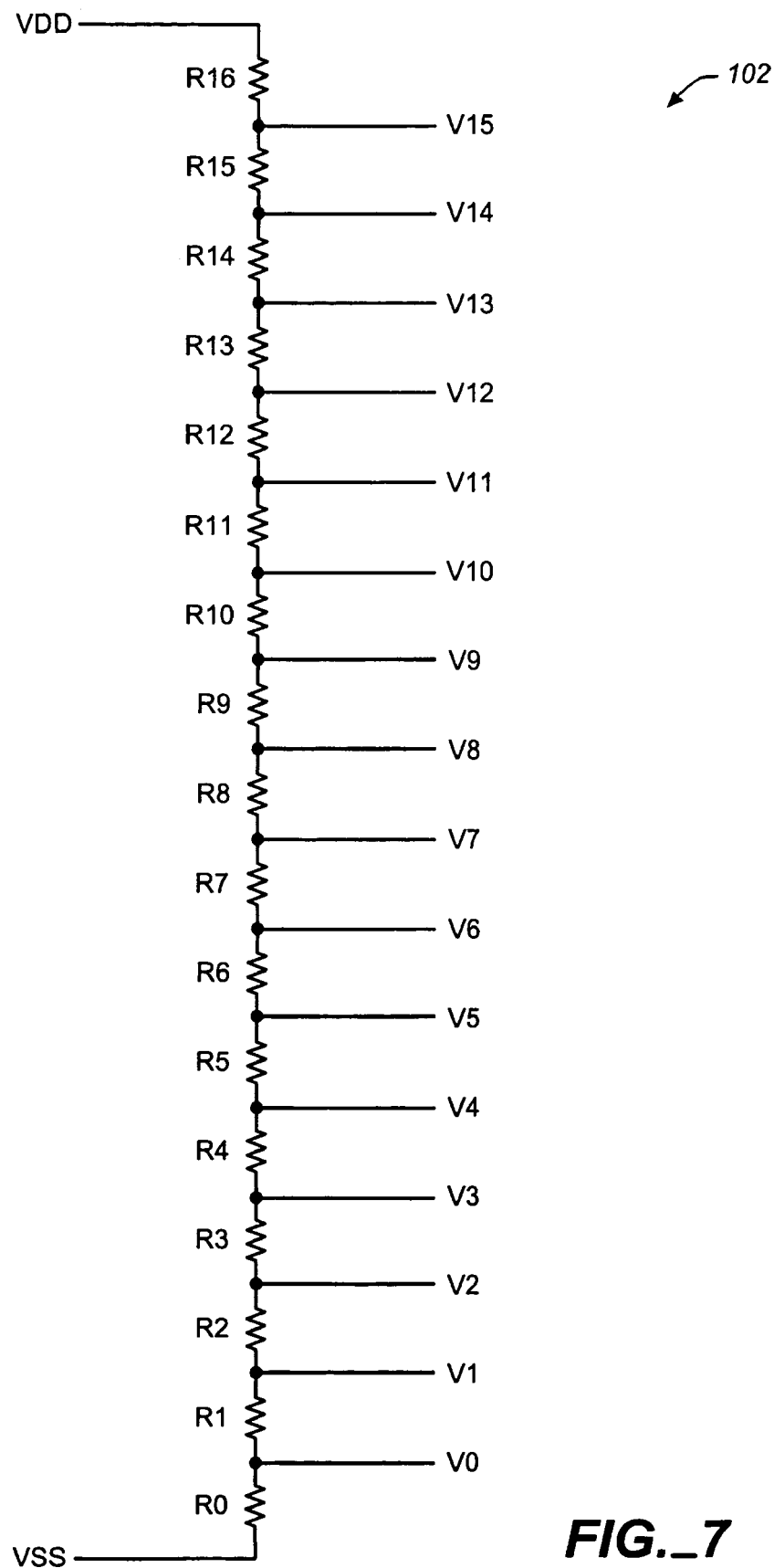
FIG._7

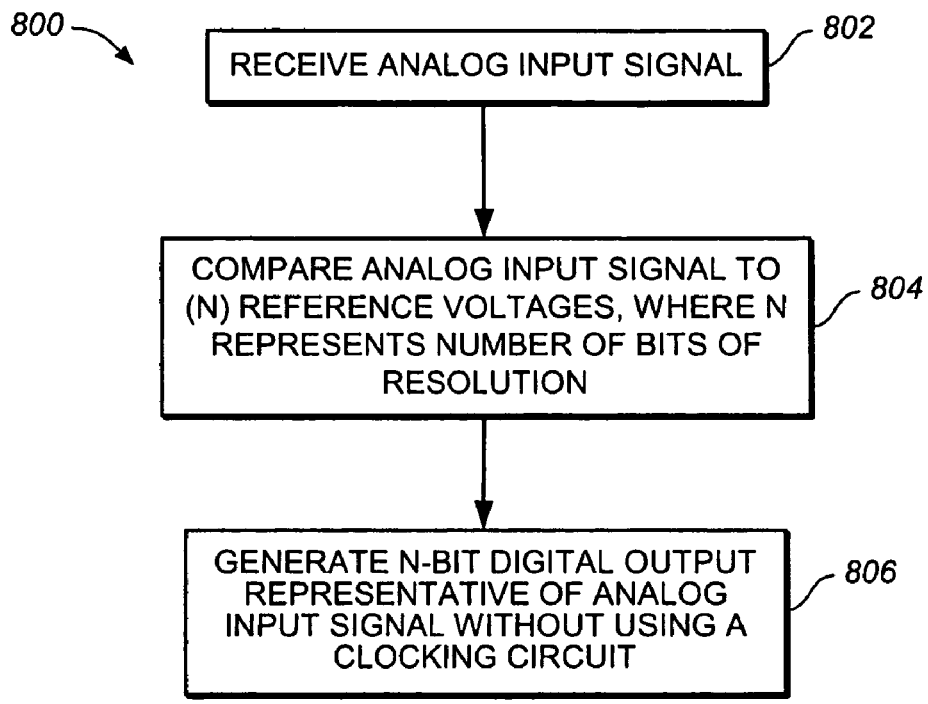
FIG._8
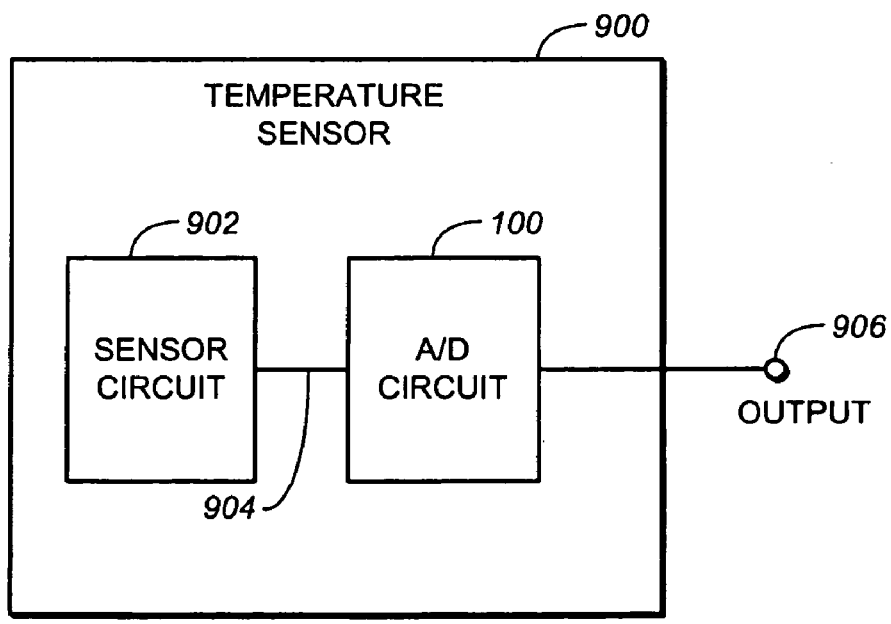
FIG._9

LOW POWER ASYNCHRONOUS DATA CONVERTER

BACKGROUND

The following disclosure relates to electrical circuits and signal processing.

Analog-to-digital conversion is the process of converting an analog input signal, that is typically represented as voltage, into a digital format. Flash (or parallel) and pipelined are examples of conventional analog-to-digital conversion architectures.

A conventional flash analog-to-digital conversion architecture generally provides a fast quantization rate per analog input signal sample. Quantization is a process for determining a digital value which represents a particular analog signal. In the flash analog-to-digital conversion architecture, a digital value can be generated per clock cycle for each analog input signal sample, without regard to N, where N represents the number of bits of resolution. A conventional flash analog-to-digital conversion architecture, however, requires that all quantization levels be simultaneously compared to a given analog input signal sample. Thus, a conventional flash analog-to-digital conversion architecture generally requires use of $2^n-1$ comparators to achieve a digital value, with N bits of resolution, per clock cycle.

A conventional pipelined analog-to-digital conversion architecture includes a method of quantizing an analog input signal sample in stages. Generally, N sample-and-hold amplifier stages are required in a pipelined analog-to-digital conversion architecture, where N represents the number of bits of resolution.

Conventional flash analog-to-digital conversion architectures and conventional pipelined analog-to-digital conversion architectures generally consume a large amount of power due to the number of required comparators and the use of high-powered sample-and-hold amplifier stages, respectively. In addition, conventional flash analog-to-digital conversion architectures and conventional pipelined analog-to-digital conversion architectures typically require a clocking circuit which consumes additional power. For example, one comparator typically consumes 10 μA of power, and a clocking circuit typically consumes 50 μA of power. Thus, a conventional 4-bit flash analog-to-digital conversion architecture generally consumes approximately 245 μA of power, where a large percentage of the power consumption is due to use of 15 comparators and an associated clocking circuit.

In general, in one aspect, this specification describes an analog-to-digital converter having N comparators. Each one of the N comparators receives a common analog input signal at a corresponding first input, and each one of the N comparators provides an output representing one bit of an N-bit digital conversion of the common analog input signal. A $p^{th}$ one of the N comparators receives a $p^{th}$ reference voltage as a second input, wherein p=1, and each of i' ones of the N comparators receives an $i'^{th}$ reference voltage at a respective second input in accordance with at least one respective output of j ones of the N comparators, in which p<i'≦N, p≦j<i' and i' and j are each integers.

Particular implementations can include one or more of the following features. The analog-to-digital converter can further include a reference voltage source that provides k voltages within a first pre-determined voltage range. An $r^{th}$ one of the k voltages is substantially ½ the first pre-determined voltage range and an $r^{th}$ voltage is input to the second input of the $p^{th}$ comparator, in which $k=2^N$ and r=k/2, and where r and k are integers. An $m^{th}$ voltage of the k voltages can be substantially equal to the first pre-determined voltage range divided by k and then multiplied by m, in which 1≦m≦k and m is an integer. The analog-to-digital converter can further include N selectors, in which an $n^{th}$ one of the N selectors selects ones of the k voltages as the second input of the $n^{th}$ comparator in accordance with the following equation: $Vref(n,i)=V(2^{(N-n)}+((i-1)*2^{(N-n)+1}))$, in which n represents an nth stage of the analog-to-digital converter, and i is an integer from 1 to n. Each of the i+1 selectors can include transistors implemented in a pass gate architecture. The pass gate architecture can include PMOS transistors. Each of the k voltages can be evenly spaced within a pre-determined voltage range.

In general, in another aspect, this specification describes an analog-to-digital converter including a reference generator and a comparator. The reference generator is operable to generate one or more reference voltages. The comparator is operable to receive an analog input signal and compare the analog input signal to one or more of the reference voltages using N comparators. The comparator is further operable to generate an N-bit digital signal representative of the analog input signal without using a reference clock, where N represents a bit resolution of the digital signal and N is an integer greater than 1.

Particular implementations can include one or more of the following features. The reference generator can generate $2^N$ reference voltages. The analog-to-digital converter can further include a switch network operable to select ones of the one or more reference voltages and provide the selected reference voltages to the comparator for comparison with the analog input signal. The selected reference voltages can substantially represent a midpoint of a pre-determined voltage range. An output of each of the N comparators can form the N-bit digital signal representative of the analog input signal.

In general, in another aspect, this specification describes a method for determining a digital representation of a corresponding analog input signal. The method includes receiving an analog input signal; performing N comparisons of the analog input signal to one or more reference voltages; and using results of the N comparisons, forming an N-bit digital signal corresponding to the analog input signal. N represents a pre-determined bit resolution of a digital output signal and performing N comparisons includes performing N comparisons of the analog input signal to one or more reference voltages without using a reference clock.

Particular implementations can include one or more of the following features. The method can further include providing one or more reference voltages substantially representing a corresponding midpoint of a pre-determined voltage range. Performing N comparisons can include successively performing N comparisons using a binary search technique. Successively performing N comparisons can include determining N times if the analog input signal is greater than or less than N different reference voltages, in which each of the N different reference voltages substantially represent a corresponding midpoint of a corresponding pre-determined voltage range.

In general, in another aspect, this specification describes an apparatus including a circuit to generate an analog signal that varies slowly with respect to time; a reference generator operable to generate one or more reference voltages; and a comparator operable to receive the analog signal and compare the analog signal to one or more of the reference voltages using N comparators. The comparator is further operable to generate an N-bit digital signal representative of the analog signal without using a reference clock, in which N represents a bit resolution of the digital signal and N is an integer greater than 1.

Implementations can include one or more of the following advantages. An analog-to-digital conversion circuit is provided that includes a maximum of N comparators, where N represents the number of bits of resolution of a digital output signal. In addition, the analog-to-digital conversion circuit provided is asynchronous in that the analog-to-digital conversion circuit does not require a reference clock or a clocking circuit for converting an analog input signal into a digital format. Thus, for example, an analog-to-digital conversion circuit provided herein, using 4-bits of resolution, will generally consume a maximum of 85 µA of power, which is substantially less than conventional 4-bit flash analog-to-digital conversion architectures and conventional 4-bit pipelined analog-to-digital conversion architectures. Furthermore, in one implementation, the analog-to-digital conversion circuit includes a pass gate architecture that is used within an associated switch network. Use of a pass gate architecture eliminates the need of complex logic circuits, that may consume additional power.

The details of one or more implementations are set forth in the accompanying drawings and the description below. Other features and advantages will be apparent from the description and drawings, and from the claims.

DESCRIPTION OF DRAWINGS

FIG. 1 is a block diagram of an analog-to-digital conversion architecture.

FIG. 2 is a schematic diagram of an analog-to-digital conversion circuit.

FIG. 3 is a tree diagram illustrating a binary search technique.

FIG. 4 is a schematic diagram of a 2-input switch of the analog-to-digital conversion circuit of FIG. 2.

FIG. 5 is a schematic diagram of a 4-input switch of the analog-to-digital conversion circuit of FIG. 2.

FIG. 6 is a schematic diagram of an 8-input switch of the analog-to-digital conversion circuit of FIG. 2.

FIG. 7 is a schematic diagram of a reference generator of the analog-to-digital conversion circuit of FIG. 2.

FIG. 8 is a process for determining a digital value which represents a particular analog input signal.

FIG. 9 is a block diagram of a temperature sensor.

Like reference symbols in the various drawings indicate like elements.

DETAILED DESCRIPTION

FIG. 1 is a block diagram of an analog-to-digital conversion circuit 100 for converting an analog input signal into a digital format. Analog-to-digital conversion circuit 100 includes a reference generator 102, a comparator circuit 104, and a switch network 106. Comparator circuit 104 receives an analog input signal 108 representative of a possible input voltage to be determined (or measured), and generates a corresponding digital output signal 110 representative of analog input signal 108. In one implementation, analog input signal 108 is a continuous signal. Unlike a conventional flash analog-to-digital conversion architecture or a conventional pipelined analog-to-digital conversion architecture, analog-to-digital conversion circuit 100 does not require a reference clock or a clocking circuit to convert an analog input signal into a digital format.

Reference generator 102 includes a reference voltage source (not shown) that is divided into a number of segments (i.e., quantization levels) desired for a particular measurement accuracy and bit resolution. For example, a desired measurement accuracy using 4-bits of resolution requires 16 quantization levels within a given voltage range (as discussed in greater detail below). Comparator circuit 104 includes N comparators (not shown), where N represents the number of bits of resolution. In one implementation, the N comparators of comparator circuit 104 compare selected quantization levels of reference generator 102 to generate an N-bit digital signal corresponding to analog input signal 108. Switch network 106 can include any number of conventional switching devices. Switch network 106 is coupled to reference generator 102, and selects a quantization level (or reference voltage) to be provided to ones of the N comparators of comparator circuit 104.

FIG. 2 shows one implementation of analog-to-digital conversion circuit 100 in greater detail. In the implementation of FIG. 2, analog-to-digital conversion circuit 100 measures analog input signal 108 according to 4-bits of resolution. Comparator circuit 104, therefore, includes (4) comparators—e.g., comparators 202–208. Comparators 202–208 can be arranged in a pipelined fashion (having 4 stages). In addition, reference generator 102 generates (16) quantization levels—i.e., V0–15, that, in one implementation, are equally spaced within a given voltage range. Switch network 106 includes (3) switches 210–214.

As shown in FIG. 2, comparator 202 receives as inputs analog input signal 108 and reference voltage V8. The output of comparator 202 is coupled to a control input of each of switches 210–214. Comparator 204 receives as inputs analog input signal 108 and the output of switch 210. The output of comparator 204 is coupled to a control input of each of switches 212–214. Comparator 206 receives as inputs analog input signal 108 and the output of switch 212. The output of comparator 206 is coupled to a control input of switch 214. Comparator 208 receives as inputs analog input signal 108 and the output of switch 212.

In operation, analog-to-digital conversion circuit 100 can be used to generate a digital value of analog input signal 108 as follows. Analog input signal 108 is applied to one input of each of comparators 202–208. Comparator 202 compares analog input signal 108 to reference voltage V8, which, in one implementation, substantially represents the midpoint of a pre-determined voltage range. Analog input signal 108 is either greater than or less than reference voltage V8, and comparator 202 accordingly generates an output B3. Output B3 represents the most significant bit (MSB) of a digital value of analog input signal 108. Once output B3 is determined, output B3 selectively controls switch 210 to output either reference voltage V12 or reference voltage V4 as VREF2. Reference voltage V12 substantially represents a midpoint of one half (e.g., the upper half) of the pre-determined voltage range, and reference voltage V4 substantially represents a midpoint of a second half (e.g., the lower half) of the pre-determined voltage range.

Comparator 204 compares analog input signal 108 to VREF2, and generates an output B2. Output B2 represents the next least significant bit (or MSB-1) of the digital value of analog input signal 108. Once output B2 is determined, outputs B2 and B3 are used to selectively control switch 212 to output one of reference voltages. V14, V10, V6 and V2 as VREF1. Reference voltages V14, V10, V6 and V2 substantially represent corresponding midpoints of a portion of the pre-determined voltage range.

Comparator 206 compares analog input signal 108 to VREF1, and generates an output B1. Output B1 represents the next least significant bit (or MSB-2) of the digital value of analog input signal 108. Once output B1 is determined, outputs B1, B2 and B3 are used to selectively control switch 214 to output one of reference voltages V15, V13, V1, V9, V7, V5, V3 and V1 as VREF0. Comparator 208 compares analog input signal 108 to VREF0, and generates an output B0. Output B0 represents the least significant bit (LSB) of the digital value of analog input signal 108. Outputs B3, B2, B1 and B0, therefore, form a 4-bit digital value representative of analog input signal 108.

More generally, each switch within the pipelined stages of analog-to-digital conversion circuit 100 is operable to selectively output one of two or more input reference voltage references. The two or more input voltage references for each switch can be determined according to the following equation.

$$Vref(n,i)=\text{reference value in } n^{th} \text{ stage}, i=\{1,n\} Vref(n,i)=V(2^{(N-n)}+((i-1)*2^{(N-n)+1})), \quad \text{(eq. 1)}$$

where N represents the bit resolution of the digital output signal, n represents the nth stage of the analog-to-digital conversion circuit, and i is an integer from 1 to n.

Thus, for example, if N=4 then the input reference voltages for each switch is as follows:

$n=1$, $Vref(1,1)=V(2^3+0)=V(8)$, $n=2$, $Vref(2,1)=V(2^2 0)=V(4)$, $Vref(2,2)=V(2^2+2^3)=V(12)$, $n=3$, $Vref(3,1)=V(2^1+0)=V(2)$, $Vref(3,2)=V(2^1+2^1)=V(4)$ $Vref(3,3)=V(2^1+2^2)=V(6)$, and so on.

FIG. 3 shows a tree diagram 300 that represents one implementation of a binary search technique implemented by analog-to-digital conversion circuit 100 as discussed with respect to FIG. 2. For example, referring to FIGS. 2 and 3, comparator 202 compares analog input signal 108 to reference voltage V8 at node 302. If analog input signal 108 is greater than reference voltage V8, then binary tree 300 is traversed to node 304. At node 304 comparator 204 compares analog input signal 108 to reference voltage V12. If analog input signal 108 is greater than reference voltage V12, then binary tree 300 is traversed to node 306. At node 306 comparator 206 compares analog input signal 108 to reference voltage V14. If analog input signal 108 is greater than reference voltage V14, then binary tree 300 is traversed to node 308. At node 308 comparator 208 compares analog input signal 108 to reference voltage V15. If analog input signal 108 is greater than reference voltage V15, then the digital representation of analog input signal 108 is determined as "1111", otherwise the digital representation of analog input signal 108 is determined as "1110".

FIGS. 4–6 show one implementation of switches 210–214, respectively, in a pass gate architecture—i.e., using a network of pass transistors (or switches). In one implementation, all the pass transistors of switches 210–214 are PMOS transistors.

Referring to FIG. 4, switch 210 includes PMOS transistors 402–404. Output B3 is applied to the gate of PMOS transistor 402, and the complement of output B3 is applied to the gate of PMOS transistor 404. Switch 210 receives as inputs reference voltage V12 and reference voltage V4, and is operable to pass (or output) reference voltage V12 or reference voltage V4 as reference voltage VREF2 based on a value of output B3. For example, if output B3 is a high logic value then PMOS transistor 402 remains inactive. However, the complement of output B3 (which represents a low logic value) activates PMOS transistor 404, which passes reference voltage V4 to the output of switch 210 (as reference voltage VREF2).

Referring to FIG. 5, switch 212 includes PMOS transistors 502–512. Output B3 is applied to the gate of PMOS transistor 510, and the complement of output B3 is applied to the gate of PMOS transistor 512. Output B2 is applied to the gates of PMOS transistor 502 and PMOS transistor 506. The complement of output B2 is applied to the gates of PMOS transistor 504 and PMOS transistor 508. Similar to switch 210, switch 212 is operable to pass (or output) one of reference voltages V14, V10, V6 and V2 to the output of switch 212 as reference voltage VREF1 based on values of output B2 and output B3.

Referring to FIG. 6, switch 214 includes PMOS transistors 602–628. Output B3 is applied to the gate of PMOS transistor 626, and the complement of output B3 is applied to the gate of PMOS transistor 628. Output B2 is applied to the gates of PMOS transistor 618 and PMOS transistor 622. The complement of output B2 is applied to the gates of PMOS transistor 620 and PMOS transistor 624. Output B1 is applied to the gates of PMOS transistor 602, PMOS transistor 606, PMOS transistor 610 and PMOS transistor 614. The complement of output B1 is applied to the gates of PMOS transistor 604, PMOS transistor 608, PMOS transistor 612 and PMOS transistor 616. Switch 214 is operable to pass (or output) one of reference voltages V15, V13, V11, V9, V7, V5, V3 and V1 to the output of switch 214 as reference voltage VREF0 based on values of outputs B1, B2 and B3.

FIG. 7 shows one implementation of reference generator 102. Reference generator 102 includes a series resistor network of resistors R0–R16 that divides a reference voltage VDD into a number of quantization levels. In one implementation, $2^N$ quantization levels are generated by reference generator 102, where N represents the number of bits of resolution of a digital output signal. In one implementation, the quantization levels are divided evenly within a given voltage range. In one implementation, resistors R1–R16 have a resistance value of 1K ohm, and resistor R0 has a resistance value of 45K ohms. Reference generator 102 can provide one or more of reference voltages V0–V15 to comparator circuit 104 (FIG. 2) and/or switch network 106 (FIG. 2).

Reference generator 102 can be biased to provide a non-uniform step size between each quantization level, which accordingly may impact comparison tests of comparators 202–208. For example, instead of comparing whether one voltage is less than (or greater than) another voltage, comparators 202–208 may compare whether a voltage is greater than or equal to (or less than or equal to) another voltage.

FIG. 8 shows a process 800 for determining a digital value which represents a particular analog input signal. An analog input signal is received (step 802). In one implementation, the analog input signal is a continuous signal. In one implementation, the analog input signal is a low-speed analog input signal—i.e., a voltage (or current) level of the analog input signal does not vary quickly with respect to time. The analog input signal is compared to N reference voltages, where N represents the number of bits of resolution (step 804). In one implementation, the analog input signal is successively compared to a reference voltage that represents a midpoint of a given voltage range, e.g., similar to successive comparisons used within a binary search technique. In one implementation, N comparators are used to compare the N reference voltages to the analog input signal. An N-bit digital output representative of the analog input signal is generated without using a clocking circuit (step 806).

Analog-to-digital conversion circuit 100 can be used in a wide range of applications that require measurement of a low-speed analog input signal. For example, analog-to-digital conversion circuit 100 can be used within a temperature sensor 900, as shown in FIG. 9. Temperature sensor 900 includes a sensor circuit 902 and analog-to-digital conversion circuit 100. Sensor circuit 902 includes circuitry (e.g., thermocouples and thermistors) that generates one or more analog signals 904 representative of one or more temperature levels. Analog-to-digital conversion circuit 100 receives each analog signal 904 and determines an N-bit digital representation of analog signal 904. Temperature sensor 900 can output the N-bit digital representation of analog signal 904 as output 906.

A number of implementations have been described. Nevertheless, various modifications to the implementations may be made. For example, analog input signal 108 can be provided to comparator circuit 104 in a non-continuous manner, e.g., through a sample-and-hold circuit. The pass transistors of switches 210–214 can include NMOS transistors. In addition, steps of methods described above may be performed in a different order and still achieve desirable results. Accordingly, other implementations are within the scope of the following claims.

What is claimed is:

1. An analog to digital converter having a resolution of N bits, N being an integer greater than 1, comprising:
   N asynchronous comparators,
   wherein each one of the N comparators receives a common analog input signal at a corresponding first input,
   wherein each one of the N comparators provides an asynchronous output representing one bit of an N-bit digital conversion of the common analog input signal,
   wherein a pth one of the N comparators receives a pth reference voltage as a second input, wherein p=1, and
   wherein each of i' ones of the N comparators receives an i'th reference voltage at a respective second input in accordance with at least one respective output of j ones of the N comparators, wherein p<i'≦N and wherein p≦j<i', wherein i' and j are each integers and where the common analog input signal is asynchronous with respect to each output of the N comparators.

2. The analog to digital converter of claim 1, further comprising a reference voltage source providing k voltages within a first pre-determined voltage range,
   wherein an rth one of the k voltages is substantially ½ the first pre-determined voltage range,
   wherein the rth voltage is input to the second input of the pth comparator,
   wherein k=2N,
   wherein r=k/2, and
   wherein r and k are integers.

3. The analog to digital converter of claim 2, wherein an mth voltage of the k voltages is substantially equal to the first predetermined voltage range divided by k and then multiplied by m, wherein 1≦m≦k, and wherein m is an integer.

4. The analog to digital converter of claim 3, further comprising N selectors, wherein a nth one of the N selectors selects ones of the k voltages as the second input of the nth comparator in accordance with the following equation, $$Vref(n,i)=V(2(N-n)+((i-1)*2((N-n)+1))),$$

wherein n represents an nth stage of the analog to digital converter, and i is an integer from 1 to n.

5. The analog to digital converter of claim 4, wherein each of the i+1 selectors includes transistors implemented in a pass gate architecture.

6. The analog to digital converter of claim 5, wherein the pass gate architecture includes PMOS transistors.

7. The analog to digital converter of claim 2, wherein each of the k voltages are evenly spaced within the first pre determined voltage range.

8. The analog to digital converter of claim 1, wherein the pth comparator outputs a most significant bit of the N bit digital conversion of the common analog input signal.

9. The analog to digital converter of claim 1, wherein one of the i' ones of the N comparators outputs a least significant bit of the N bit digital conversion of the common analog input signal.

10. An analog to digital converter, comprising:
    a reference generator operable to generate one or more reference voltages; and
    a comparator operable to receive an analog input signal and compare the analog input signal to one or more of the reference voltages using N asynchronous comparators, the comparator further operable to generate an asynchronous output of the form of an N-bit digital signal representative of the analog input signal without using a reference clock, where N represents a bit resolution of the digital signal and N is an integer greater than 1, the N comparators being coupled in a cascade such that an output of an upstream comparator provides a portion of the output signal of the analog to digital converter and is also used to select an input signal to be used by a downstream comparator in the cascade.

11. The analog to digital converter of claim 10, wherein the reference generator generates 2N reference voltages.

12. The analog to digital converter of claim 11, wherein each of the 2N reference voltages are evenly spaced within a pre determined voltage range.

13. The analog to digital converter of claim 10, further comprising a switch network operable to select ones of the one or more reference voltages, and provide the selected reference voltages to the comparator for comparison with the analog input signal.

14. An analog to digital converter, comprising:
    a reference generator operable to generate one or more reference voltages;
    a comparator operable to receive an analog input signal and compare the analog input signal to one or more of the reference voltages using N comparators, the comparator further operable to generate an N-bit digital signal representative of the analog input signal without using a reference clock, where N represents a bit resolution of the digital signal and N is an integer greater than 1; and
    a switch network operable to select ones of the one or more reference voltages, and provide the selected reference voltages to the comparator for comparison with the analog input signal, the switch network includes N selectors arranged in a pipelined fashion that includes n stages, each of the N selectors operable to select ones of the one or more reference voltages based on the following equation, $Vref(n,i)=V(2(N-n)+((i-1)*2(N-n)+1))$, wherein n represents the nth stage, and i is an integer from 1 to n.

15. The analog to digital converter, of claim 13, wherein the selected reference voltages substantially represent a midpoint of a pre determined voltage range.

16. The analog to digital converter of claim 15, wherein the switch network includes transistors implemented in a pass gate architecture.

17. The analog to digital converter of claim 16, wherein the pass gate architecture includes PMOS transistors.

18. The analog to digital converter of claim 10, wherein an output of each of the N comparators form the N-bit digital signal representative of the analog input signal.

19. A method for converting an analog input signal into an N-bit digital representation, N being an integer greater than 1, comprising:
    performing N asynchronous comparisons of the analog input signal to a corresponding reference voltage; and
    asynchronously outputting a corresponding bit of the N-bit digital representation based on the N comparisons,
    wherein a pth one of the N comparisons includes comparing the analog input signal to a pth reference voltage, wherein p=1, and
    wherein each one of the i' ones of the N comparisons include comparing the analog input signal to an i'th reference voltage in accordance with a respective output of j ones of the comparisons, wherein $p<i'\leq N$ and wherein $p\leq j<i'$, wherein i' and j are each integers and where the analog input signal is asynchronous with respect to the output of the asynchronously outputting step.

20. The method of claim 19, further comprising providing k voltages within a first predetermined voltage range,
    wherein an rth one of the k voltages is substantially ½ the first pre-determined voltage range,
    wherein the rth voltage is compared to the analog input signal in the pth comparison,
    wherein k=2N,
    wherein r=k/2, and
    wherein r and k are integers.

21. The method of claim 20, wherein an mth voltage of the k voltages is substantially equal to the first pre-determined voltage range divided by k and then multiplied by m, wherein $1\leq m\leq k$, and wherein m is an integer.

22. The method of claim 21, further comprising selecting ones of the k voltages for comparison with the analog input signal during the nth comparison in accordance with the following equation, $Vref(n,i)=V(2(N-n)+((i-1)*2((N-n)+1))$, wherein n represents an nth stage of an analog to digital converter, and i is an integer from 1 to n.

23. The method of claim 20, wherein each of the k voltages are evenly spaced within the first pre determined voltage range.

24. The method of claim 19, wherein the pth comparison results in an output of a most significant bit of the N bit digital representation of the analog input signal.

25. The method of claim 19, wherein one of the i' ones of the N comparisons results in an output of a least significant bit of the N bit digital representation of the analog input signal.

26. A method for determining a digital representation of a corresponding analog input signal, the method comprising:
    receiving an analog input signal;
    performing a cascade of N asynchronous comparisons of the analog input signal to one or more reference voltages, where N represents a pre-determined bit resolution of a digital output signal; and
    using results of the N comparisons, forming an asynchronous output of the form of an N bit digital signal corresponding to the analog input signal,
    wherein performing N comparisons includes performing N comparisons of the analog input signal to one or more reference voltages without using a reference clock and a downstream comparison in the comparisons is made in accordance with an upstream comparison and where the analog input signal is asynchronous with respect to the output of the forming step.

27. The method of claim 26, further comprising generating 2N reference voltages for comparison with the analog input signal.

28. The method of claim 27, wherein generating 2N reference voltages includes generating 2N reference voltages that are evenly spaced within a pre determined voltage range.

29. The method of claim 26, further comprising providing ones of the 2N reference voltages for comparison with the analog input signal, the provided ones of the 2N reference voltages substantially representing a corresponding midpoint of a pre determined voltage range.

30. The method of claim 26, wherein performing N comparisons includes successively performing N comparisons using a binary search technique.

31. A method for determining a digital representation of a corresponding analog input signal, the method comprising:
    receiving an analog input signal;
    performing N asynchronous comparisons of the analog input signal to one or more reference voltages, where N represents a predetermined bit resolution of a digital output signal; and
    using results of the N comparisons, forming an asynchronous output of the form of an N bit digital signal corresponding to the analog input signal,
    wherein performing N comparisons includes performing N comparisons of the analog input signal to one or more reference voltages without using a reference clock, performing N comparisons includes successively performing N comparisons using a binary search technique, and successively performing N comparisons includes determining N times if the analog input signal is greater than or less than N different reference voltages, each of the N different reference voltages substantially representing a corresponding midpoint of a corresponding pre-determined voltage range and where the analog input signal is asynchronous with respect to the output of the forming step.

32. The method of claim 31, wherein the first of the successive comparisons results in an output of a most significant bit of the N bit digital signal corresponding to the analog input signal.

33. The method of claim 31, wherein the last of the successive comparisons results in an output of a least significant bit of the N bit digital signal corresponding to the analog input signal.

34. An apparatus, comprising:
    a circuit to generate an analog signal that does not vary quickly with respect to time;
    a reference generator operable to generate one or more reference voltages; and a comparator operable to receive the analog signal and compare the analog signal to one or more of the reference voltages using N asynchronous comparators, the comparator further operable to generate an asynchronous output of the form of an N-bit digital signal representative of the analog signal without using a reference clock, where N represents a bit resolution of the digital signal and N is an integer greater than 1, and the N comparators being coupled in a cascade such that an output of an upstream comparator provides a portion of the output signal of the analog-to digital converter and is also used to select an input signal to be used by a downstream comparator in the cascade.

35. The apparatus of claim 34, wherein the reference generator generates 2N reference voltages.

36. The apparatus of claim 35, wherein each of the 2N reference voltages are evenly spaced within a pre determined voltage range.

37. The apparatus of claim 34, further comprising a switch network operable to select ones of the one or more reference voltages, and provide the selected reference voltages to the comparator for comparison with the analog signal.

38. An apparatus, comprising:
a circuit to generate an analog signal that does not vary quickly with respect to time;
a reference generator operable to generate one or more reference voltages;
a comparator operable to receive the analog signal and compare the analog signal to one or more of the reference voltages using N comparators, the comparator further operable to generate an N-bit digital signal representative of the analog signal without using a reference clock, where N represents a bit resolution of the digital signal and N is an integer greater than 1;
a switch network operable to select ones of the one or more reference voltages, and provide the selected reference voltages to the comparator for comparison with the analog signal,
wherein the switch network includes N selectors arranged in a pipelined fashion that includes n stages, and each of the N selectors operable to select ones of the one or more reference voltages based on the following equation, $Vref(n,i)=V(2(N-n)+((i-1)*2((N-n)+1))$, wherein n represents the nth stage, and i is an integer from 1 to n.

39. The apparatus of claim 37, wherein the selected reference voltages substantially represent a midpoint of a pre determined voltage range.

40. The apparatus of claim 39, wherein the switch network includes transistors implemented in a pass gate architecture.

41. The apparatus of claim 40, wherein the pass gate architecture includes PMOS transistors.

42. The apparatus of claim 34, wherein an output of each of the N comparators form the N-bit digital signal representative of the analog signal.

43. The apparatus of claim 34, wherein the apparatus is a temperature sensor.

44. An analog to digital converter having a resolution of N bits, N being an integer greater than 1, comprising:
N asynchronous comparator means, wherein each one of the N comparator means receives a common analog input signal at a corresponding first input, each one of the N comparator means for providing an asynchronous output representing one bit of an N-bit digital conversion of the common analog input signal,
wherein a pth one of the N comparator means receives a pth reference voltage means as a second input, wherein p=1, and
wherein each of i' ones of the N comparator means receives an i'th reference voltage means at a respective second input in accordance with at least one respective output of j ones of the N comparator means, wherein p<i'≦N and wherein p≦j<i', wherein i' and j are each integers and where the common analog input signal is asynchronous with respect to the output of the N asynchronous comparator means.

45. The analog to digital converter of claim 44, further comprising a reference voltage source means for providing k voltage means within a first pre-determined voltage range,
wherein an rth one of the k voltage means is substantially ½ the first pre-determined voltage range,
wherein the rth voltage means is input to the second input of the pth comparator means, and
wherein k=2N, wherein r=k/2, and
wherein r and k are integers.

46. The analog to digital converter of claim 45, wherein an mth voltage means of the k voltage means is substantially equal to the first pre determined voltage range divided by k and then multiplied by m, wherein 1≦m≦k, and wherein m is an integer.

47. The analog to digital converter of claim 46, further comprising N selector means, wherein a nth one of the N selector means selects ones of the k voltage means as the second input of the nth comparator means in accordance with the following equation, $Vref(n,i)=V(2(N-n)+((i-1)*2((N-n)+1))$, wherein n represents an nth stage of the analog to digital converter, and i is an integer from 1 to n.

48. The analog to digital converter of claim 47, wherein each of the i+1 selector means includes transistor means implemented in a pass gate architecture.

49. The analog to digital converter of claim 48, wherein the pass gate architecture includes PMOS transistor means.

50. The analog to digital converter of claim 45, wherein each of the k voltage means are evenly spaced within the first pre determined voltage range.

51. The analog to digital converter of claim 44, wherein the pth comparator means outputs a most significant bit of the N-bit digital conversion of the common analog input signal.

52. The analog to digital converter of claim 44, wherein one of the i' ones of the N comparator means outputs a least significant bit of the N-bit digital conversion of the common analog input signal.

53. An analog to digital converter, comprising:
reference generator means for generating one or more reference voltage means; and
comparator means for receiving an analog input signal and comparing the analog input signal to one or more of the reference voltage means using N asynchronous comparator means, the comparator means further generating an asynchronous output of the form of an N-bit digital signal representative of the analog input signal without using a reference clock means, where N represents a bit resolution of the digital signal and N is an integer greater than 1, the N comparator means being coupled in a cascade such that an output of an upstream comparator means provides a portion of the output signal of the analog-to digital converter and is also used to select an input signal to be used by a downstream comparator means in the cascade.

54. The analog to digital converter of claim 53, wherein the reference generator means generates 2N reference voltage means.

55. The analog to digital converter of claim 54, wherein each of the 2N reference voltage means are evenly spaced within a pre determined voltage range.

56. The analog to digital converter of claim 53, further comprising switch network means for selecting ones of the one or more reference voltage means, and providing the selected reference voltage means to the comparator means for comparison with the analog input signal.

57. An analog to digital converter, comprising:
reference generator means for generating one or more reference voltage means;
comparator means for receiving an analog input signal and comparing the analog input signal to one or more of the reference voltage means using N comparator means, the comparator means further generating an N-bit digital signal representative of the analog input signal without using a reference clock means, where N represents a bit resolution of the digital signal and N is an integer greater than 1; and
switch network means for selecting ones of the one or more reference voltage means, and providing the selected reference voltage means to the comparator means for comparison with the analog input signal, wherein the switch network means includes N selector means arranged in a pipelined fashion that includes n stages, each of the N selector means operable to select ones of the one or more reference voltage means based on the following equation, $$Vref(n,i)=V(2(N-n)+((i-1)*2((N-n)+1)),$$

wherein n represents the nth stage, and i is an integer from 1 to n.

58. The analog to digital converter of claim 56, wherein the selected reference voltage means substantially represent a midpoint of a pre determined voltage range.

59. The analog to digital converter of claim 58, wherein the switch network means includes transistor means implemented in a pass gate architecture.

60. The analog to digital converter of claim 59, wherein the pass gate architecture includes PMOS transistor means.

61. The analog to digital converter of claim 53, wherein an output of each of the N comparator means form the N-bit digital signal representative of the analog input signal.

62. An apparatus, comprising:
circuit means for generating an analog signal that varies slowly with respect to time;
reference generator means for generating one or more reference voltage means; and
comparator means for receiving the analog signal and comparing the analog signal to one or more of the reference voltage means using N asynchronous comparator means, the comparator means further generating an asynchronous output of the form of an N-bit digital signal representative of the analog signal without using a reference clock means, where N represents a bit resolution of the digital signal and N is an integer greater than 1, and the N comparator means being coupled in a cascade such that an output of an upstream comparator means provides a portion of the output signal of the analog-to digital converter and is also used to select an input signal to be used by a downstream comparator means in the cascade.

63. The apparatus of claim 62, wherein the reference generator means generates 2N reference voltage means.

64. The apparatus of claim 63, wherein each of the 2N reference voltage means are evenly spaced within a pre determined voltage range.

65. The apparatus of claim 62, further comprising switch network means for selecting ones of the one or more reference voltage means, and providing the selected reference voltage means to the comparator means for comparison with the analog signal.

66. An apparatus, comprising:
circuit means for generating an analog signal that varies slowly with respect to time;
reference generator means for generating one or more reference voltage means; and
comparator means for receiving the analog signal and comparing the analog signal to one or more of the reference voltage means using N comparator means, the comparator means further generating an N-bit digital signal representative of the analog signal without using a reference clock means, where N represents a bit resolution of the digital signal and N is an integer greater than 1; and
switch network means for selecting ones of the one or more reference voltage means, and providing the selected reference voltage means to the comparator means for comparison with the analog signal, wherein the switch network means includes N selector means arranged in a pipelined fashion that includes n stages, each of the N selector means operable to select ones of the one or more reference voltage means based on the following equation, $$Vref(n,i)=V(2(N-n)+((i-1)*2((N-n)+1)),$$

wherein n represents the nth stage, and i is an integer from 1 to n.

67. The apparatus of claim 65, wherein the selected reference voltage means substantially represent a midpoint of a pre determined voltage range.

68. The apparatus of claim 67, wherein the switch network means includes transistor means implemented in a pass gate architecture.

69. The apparatus of claim 68, wherein the pass gate architecture includes PMOS transistor means.

70. The apparatus of claim 62, wherein an output of each of the N comparator means form the N-bit digital signal representative of the analog input signal.

71. The apparatus of claim 62, wherein the apparatus is a temperature sensor means.

72. An apparatus, comprising:
a circuit to generate an analog signal that does not vary quickly with respect to time; and
N asynchronous comparators,
wherein each one of the N comparators receives the analog signal at a corresponding first input,
wherein each one of the N comparators provides an asynchronous output representing one bit of an N-bit digital conversion of the analog signal,
wherein a pth one of the N comparators receives a pth reference voltage as a second input, wherein p=1, and
wherein each of i' ones of the N comparators receives an i'th reference voltage at a respective second input in accordance with at least one respective output of j ones of the N comparators, wherein p<i'≦N and wherein p≦j<i', wherein i' and j are each integers and where the analog signal is asynchronous with respect to the output of the N comparators.

73. The apparatus of claim 72, further comprising a reference voltage source providing k voltages within a first pre-determined voltage range, wherein an rth one of the k voltages is substantially ½ the first pre-determined voltage range, wherein the rth voltage is input to the second input of the pth comparator, wherein k=2N, wherein r=k/2, and wherein r and k are integers.

74. The apparatus of claim 73, wherein an mth voltage of the k voltages is substantially equal to the first pre determined voltage range divided by k and then multiplied by m, wherein $1 \leq m \leq k$, and wherein m is an integer.

75. The apparatus of claim 74, further comprising N selectors, wherein a nth one of the N selectors selects ones of the k voltages as the second input of the nth comparator in accordance with the following equation, $$Vref(n,i)=V(2(N-n)+((i-1)*((N-n)+1))),$$

wherein n represents an nth stage of the analog to digital converter, and i is an integer from 1 to n.

76. The apparatus of claim 75, wherein each of the i+1 selectors includes transistors implemented in a pass gate architecture.

77. The apparatus of claim 76, wherein the pass gate architecture includes PMOS transistors.

78. The apparatus of claim 73, wherein each of the k voltages are evenly spaced within the first pre determined voltage range.

79. The apparatus of claim 72, wherein the pth comparator outputs a most significant bit of the N bit digital conversion of the analog signal.

80. The apparatus of claim 72, wherein one of the i' ones of the N comparators outputs a least significant bit of the N bit digital conversion of the common analog input signal.

81. An apparatus, comprising:

circuit means to generate an analog signal that does not vary quickly with respect to time; and N asynchronous comparator means, wherein each one of the N comparator means receives the analog signal at a corresponding first input, wherein each one of the N comparator means provides an asynchronous output representing one bit of an N-bit digital conversion of the analog signal, wherein a pth one of the N comparator means receives a pth reference voltage means as a second input wherein p=1, and wherein each of i' ones of the N comparator means receives an i'th reference voltage means at a respective second input in accordance with at least one respective output of j ones of the N comparator means, wherein p<i≦N and wherein p≦j<i', wherein i' and j are each integers and where the analog signal is asynchronous with respect to the output of the N comparator means.

82. The apparatus of claim 81, further comprising a reference voltage source means for providing k voltage means within a first pre-determined voltage range, wherein an rth one of the k voltage means is substantially ½ the first pre-determined voltage range, wherein the rth voltage means is input to the second input of the pth comparator means, and wherein k=2N, wherein r=k/2, and wherein r and k are integers.

83. The apparatus of claim 82, wherein an mth voltage means of the k voltage means is substantially equal to the first pre determined voltage range divided by k and then multiplied by m, wherein $1 \leq m \leq k$, and wherein m is an integer.

84. The apparatus of claim 83, further comprising N selector means, wherein a nth one of the N selector means selects ones of the k voltage means as the second input of the nth comparator means in accordance with the following equation, $$Vref(n,i)=V(2(N-n)+((i-1)*2((N-n)+1))),$$

wherein n represents an nth stage of the analog to digital converter, and i is an integer from 1 to n.

85. The apparatus of claim 84, wherein each of the i+1 selector means includes transistor means implemented in a pass gate architecture.

86. The apparatus of claim 85, wherein the pass gate architecture includes PMOS transistor means.

87. The apparatus of claim 82, wherein each of the k voltage means are evenly spaced within the first pre determined voltage range.

88. The apparatus of claim 81, wherein the pth comparator means outputs a most significant bit of the N-bit digital conversion of the analog signal.

89. The apparatus of claim 81, wherein one of the i' ones of the N comparator means outputs a least significant bit of the N-bit digital conversion of the common analog input signal.

* * * * *